(12) United States Patent
Lee

(10) Patent No.: US 9,391,168 B2
(45) Date of Patent: Jul. 12, 2016

(54) MANUFACTURING METHOD OF A THIN FILM TRANSISTOR UTILIZING A PRESSING MOLD AND ACTIVE-MATRIX DISPLAY DEVICES MADE THEREFROM

(71) Applicant: Samsung Display Co., Ltd., Yongin, Gyeonggi-do (KR)

(72) Inventor: Jung-Hun Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/025,777

(22) Filed: Sep. 12, 2013

(65) Prior Publication Data
US 2014/0077193 A1    Mar. 20, 2014

(30) Foreign Application Priority Data

Sep. 18, 2012 (KR) .......... 10-2012-0103197
Sep. 18, 2012 (KR) .......... 10-2012-0103204
Aug. 14, 2013 (KR) .......... 10-2013-0096429

(51) Int. Cl.
| | |
|---|---|
| *H01L 29/08* | (2006.01) |
| *H01L 35/24* | (2006.01) |
| *H01L 51/00* | (2006.01) |
| *H01L 29/66* | (2006.01) |
| *H01L 29/786* | (2006.01) |
| *H01L 29/423* | (2006.01) |
| *H01L 27/12* | (2006.01) |

(52) U.S. Cl.
CPC ...... *H01L 29/66742* (2013.01); *H01L 27/1292* (2013.01); *H01L 29/42384* (2013.01); *H01L 29/786* (2013.01); *H01L 29/7869* (2013.01); *H01L 29/78603* (2013.01); *H01L 2251/105* (2013.01)

(58) Field of Classification Search
CPC ............ H01L 29/66742; H01L 29/786; H01L 29/42384; H01L 29/7869; H01L 27/1292; H01L 29/78603; H01L 2251/105
See application file for complete search history.

(56) References Cited

U.S. PATENT DOCUMENTS

| | | | | |
|---|---|---|---|---|
| 5,407,846 | A | * | 4/1995 | Chan ............................ 438/156 |
| 7,858,434 | B2 | | 12/2010 | Shin et al. |
| 8,946,812 | B2 | * | 2/2015 | Ishizuka et al. ............... 257/330 |

FOREIGN PATENT DOCUMENTS

| | | |
|---|---|---|
| EP | 1 672 717 A2 | 6/2006 |
| JP | 2011-199136 A | 10/2011 |

(Continued)

*Primary Examiner* — Stephen W Smoot
*Assistant Examiner* — Vicki B Booker
(74) *Attorney, Agent, or Firm* — Lewis Roca Rothgerber Christie LLP

(57) ABSTRACT

A manufacturing method of an electronic device simplifies the process by performing a patterning process by using an imprinting technology. An electronic device manufactured by the manufacturing method is also disclosed. In one embodiment, the electronic device includes a substrate provided to have a dented portion and a non-dented portion, a gate electrode located at and in direct contact with the dented portion of the substrate, a source electrode and a drain electrode located at the non-dented portion of the substrate, and a semiconductor layer located on the gate electrode and in contact with the source electrode and the drain electrode. The gate electrode, the source electrode, and the drain electrode are formed of at least one of molybdenum, tungsten, copper, aluminum, titanium, an alloy thereof, nanowire, graphene, carbon nanotube, indium tin oxide, indium zinc oxide and combinations thereof.

5 Claims, 19 Drawing Sheets

(56) References Cited

FOREIGN PATENT DOCUMENTS

| KR | 10-2007-0098690 A | 10/2007 |
| KR | 10-2008-0029279 A | 4/2008 |
| KR | 10-2010-0012657 A | 2/2010 |
| KR | 10-2011-0133757 A | 12/2011 |
| KR | 10-2012-0049512 A | 5/2012 |

* cited by examiner

MANUFACTURING METHOD OF A THIN FILM TRANSISTOR UTILIZING A PRESSING MOLD AND ACTIVE-MATRIX DISPLAY DEVICES MADE THEREFROM

CROSS-REFERENCE TO RELATED APPLICATIONS

This application claims priority to and the benefit of Korean Patent Application Nos. 10-2012-0103197 and 10-2012-0103204, both filed on Sep. 18, 2012, and Korean Patent Application No. 10-2013-0096429, filed on Aug. 14, 2013, with the Korean Intellectual Property Office, the entire contents of all of which are hereby incorporated by reference.

BACKGROUND

1. Field

Embodiments of the present invention relate to a manufacturing method of an electronic device, the method simplifying a process by performing a patterning process using an imprinting technology utilizing a pressing mold, and an electronic device manufactured by the manufacturing method.

2. Description of the Related Art

Recently, in active-matrix display devices such as a TFT-LCD and an active matrix OLED (AMOLED), a thin film transistor formed on a transparent insulation substrate has been frequently used as a pixel driving element.

In general, the thin film transistor includes a gate electrode, a gate insulating layer, source/drain electrodes, and a semiconductor channel part in which conductivity of charges is controlled by voltage applied to the gate electrode.

In order to manufacture the thin film transistor, various kinds of fine patterns are typically formed by using a plurality of mask processes, and each mask process includes a plurality of processes such as thin film depositing (or coating), cleaning, patterning using photolithography, etching, photoresist releasing, and examining on the finished product.

Among the processes, patterning using photolithography involves a series of photo processes including coating a photoresist on the substrate, aligning a mask with the substrate, exposing the photoresist to a light source, developing the photoresist, and stripping the un-developed photoresist. Such photolithography process takes much time to be performed, consumes a lot of a stripping solution for removing the photoresist pattern, and requires a high-priced exposure device, etc. As the size of a substrate becomes larger and the pattern size becomes smaller, the price of the required exposure device greatly increases. Also, because an apparatus of controlling a mask position with high precision is required and there is a limit to the miniaturization of the pattern size due to the wavelength of light used in the exposing act, the manufacturing cost further increases.

SUMMARY

Aspects of embodiments of the present invention are directed toward a manufacturing method of an electronic device, and an electronic device manufactured by the method. In the embodiments, processing steps and a processing time are reduced by manufacturing the electronic device using an imprinting method utilizing a pressing mold.

Further, aspects of embodiments of the present invention are directed toward a pressing mold in which when an electric device is manufactured by an imprinting method using the pressing mold, a gate electrode, a drain electrode, and a source electrode may be formed concurrently (e.g. simultaneously) by forming a step between a dented portion and a non-dented portion by partial pressing, and concurrently (e.g., simultaneously) connecting an electrode pattern to the outside (i.e., without being disconnected).

According to an embodiment of the present invention, an electronic device includes: a substrate having a dented portion and a non-dented portion; a gate electrode located at the dented portion of the substrate; a source electrode and a drain electrode located at the non-dented portion of the substrate; and a semiconductor layer located on the gate electrode and in contact with the source electrode and the drain electrode.

The electronic device may further include an insulating layer between the gate electrode and the semiconductor layer.

The semiconductor layer may be formed of any one material selected from the group consisting of amorphous silicon, organic semiconductor, and oxide semiconductor.

The gate electrode may be connected to a conductive layer pattern located at the non-dented portion of the substrate.

According to another embodiment of the present invention, an electronic device includes: a substrate having a dented portion and a non-dented portion; a source electrode and a drain electrode located at the dented portion of the substrate; a gate electrode located between the source electrode and the drain electrode, and at the non-dented portion of the substrate; and a semiconductor layer located under the gate electrode and in contact with the source electrode and the drain electrode.

According to another embodiment of the present invention, a manufacturing method of an electronic device includes: forming a conductive layer pattern on a substrate; forming a dented portion by pressing a part of the conductive layer pattern to dent the substrate and the conductive layer pattern to separate the conductive layer pattern into a gate electrode, a source electrode, and a drain electrode; forming an insulating layer on the gate electrode; and forming a semiconductor layer on the insulating layer.

The forming of the dented portion may be performed by a pressing mold.

In one embodiment, the pressing mold has a protrusion and an inclined portion, and the dented portion has a bottom corresponding to the protrusion of the pressing mold and an inclination corresponding to the inclined portion of the pressing mold, and the inclination of the dented portion is coupled to an upper surface of a non-dented portion of the substrate.

In the forming of the dented portion, a temperature of the pressing mold may be in the range of about 50° C. to about 150° C.

The gate electrode may be located at the dented portion of the substrate, and the source electrode and the drain electrode may be located at the non-dented portion of the substrate.

The forming of the semiconductor layer may utilize an inkjet method or an electro-hydro-dynamic (EHD) method.

The forming of the semiconductor layer may include coating a suitable material for forming the semiconductor layer on a top surface of the conductive layer pattern located at both the dented portion of the substrate and the non-dented portion of the substrate and removing the semiconductor layer coated at the non-dented portion of the substrate.

The forming of the insulating layer may be performed before the forming of the dented portion, and the insulating layer may be formed on the conductive layer pattern.

The forming of the insulating layer and the forming of the semiconductor layer on the insulating layer may be performed before the forming of the dented portion, and the insulating layer may be formed on the conductive layer pattern and the semiconductor layer may be formed on the insulating layer.

In the forming of the dented portion, the insulating layer may be located on a contact surface between the conductive layer pattern and the pressing mold, and the dented portion may be formed in the pressing process, and the insulating layer may be concurrently transferred to the conductive layer pattern located at the dented portion.

According to another embodiment of the present invention, a manufacturing method of an electronic device includes: forming a semiconductor layer on a substrate; forming an insulating layer on the semiconductor layer; forming a conductive layer pattern on the insulating layer; and forming a first dented portion and a second dented portion by denting the conductive layer pattern, the insulating layer, and the semiconductor layer by using a pressing mold.

A source electrode and a drain electrode may be respectively formed at the first dented portion and the second dented portion, and a gate electrode may be formed at a non-dented area between the first dented portion and the second dented portion.

According to embodiments of the present invention, when an electronic device is manufactured by an imprinting method using a pressing mold, electrode patterns including an electrode located at a dented portion and an external electrode located at a non-dented portion may be formed concurrently (e.g. simultaneously) so as to be connected to each other (without being disconnected from each other) by the imprinting patterning method to form a step between the dented portion and the non-dented portion by partial pressing.

According to embodiments of the present invention, it is possible to simplify a manufacturing process and reduce a manufacturing cost and a processing time because a insulating layer, a gate electrode, a source electrode, and a drain electrode may be formed through a simple process by using the imprinting method.

The foregoing summary is illustrative only and is not intended to be in any way limiting. In addition to the illustrative aspects, embodiments, and features described above, further aspects, embodiments, and features will become apparent by referring to the drawings and the following detailed description.

DETAILED DESCRIPTION

Figure 1:
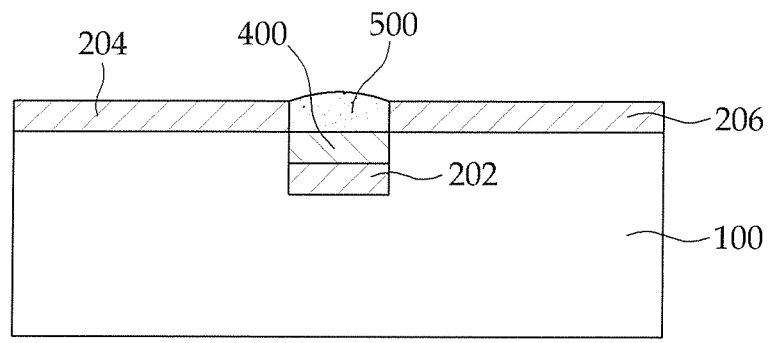
FIG. 1 is a schematic cross-sectional view illustrating a structure of an electronic device according to an embodiment of the present invention.

Hereinafter, embodiments of the present invention will be described in more detail with reference to the accompanying drawings.

Although the present invention can be modified in various manners and has several embodiments, specific embodiments are illustrated in the accompanying drawings and will be mainly described in the specification. However, the scope of the present invention is not limited to the specific embodiments and should be construed as including all the changes, equivalents, and substitutions included in the spirit and scope of the present invention.

Terms used in describing embodiments of the present invention are selected from normal terms which are widely used presently, but in some cases, there may exist a term which is arbitrarily selected by the applicant, and in such a case, the meaning thereof should be understood in light of what is being disclosed in the description or in light of the used meaning.

Some of the parts which are not associated with the description may not be provided in order to specifically describe embodiments of the present invention, and like reference numerals refer to like elements throughout the specification. Further, in the drawings, size and thickness of each element are arbitrarily illustrated for convenience of description, and the present invention is not necessarily limited to those illustrated in the drawings.

In the drawings, the thicknesses of layers and regions are enlarged for clarity. In the drawings, the thicknesses of a layer and a region are exaggerated for convenience of description. It will be understood that when an element such as a layer, film, region, or substrate is referred to as being "on" another element, it can be "directly on" the other element or intervening elements may also be present. Expressions such as "at least one of," when preceding a list of elements, modify the entire list of elements and do not modify the individual elements of the list. Further, the use of "may" when describing embodiments of the present invention refers to "one or more embodiments of the present invention." Spatially relative terms, such as "below," "beneath," "lower," "above," "upper," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings.

FIG. 1 is a schematic cross-sectional view illustrating a structure of an electronic device according to an embodiment of the present invention.

As illustrated in FIG. 1, the electronic device according to an embodiment of the present invention includes a substrate 100 having a dented portion; a gate electrode 202 disposed (i.e., located) in the dented portion; a source electrode 204 and a drain electrode 206 disposed on the substrate except for the dented portion; an insulating layer 400 disposed between the gate electrode 202 formed in the dented portion and the source electrode 204 and the drain electrode 206 formed on the substrate; and a semiconductor layer 500 coupled (or connected) to the source electrode 204 and the drain electrode 206.

The semiconductor layer 500 is in contact with the source electrode 204 and the drain electrode 206 so as to form a channel.

In more detail, the substrate 100 may be an organic material such as a flexible polymer material selected from polyethersulfone, polyacrylate, polyetherimide, polyethylene naphthalate, polyethylene terephthalate, polyphenylene sulfide, polyarylate (polyallylate), polyimide, polycarbonate, cellulose triacetate, and cellulose acetate propionate.

The substrate 100 may also be formed of glass, and a buffer layer may be further provided to form a dented portion on the substrate 100.

The buffer layer may be formed of polydimethylsiloxane (PDMS) or another flexible polymer material, and any suitable material that does not crack under the pressure of a mold when pressing is performed may be used for the buffer layer.

The substrate 100 may include a dented portion having a vertical surface perpendicular to an upper (i.e., a top) surface of the substrate 100 and an inclined surface. A plane of the dented portion is illustrated to have a quadrangular shape for convenience of description, but a shape of the plane is not restricted thereto, and the plane may be formed in various suitable shapes such as polygon (e.g. triangle or pentagon) or circle.

The gate electrode 202, source electrode 204, and drain electrode 206 may be formed of a single layer containing at least one of molybdenum, tungsten, copper, aluminum, titanium, an alloy thereof, nanowire, graphene, carbon nanotube, indium tin oxide, and indium zinc oxide; or multiple layers. The gate electrode 202 is located to extend from a bottom of the dented portion along the inclined surface to an upper surface of the substrate 100.

The gate electrode 202, source electrode 204, and drain electrode 206 may be elements of a thin film transistor (TFT), together with a semiconductor layer that will be described below.

Further, although not illustrated in the drawings, the gate electrode 202 is connected to a gate signal wiring, and the source electrode 204 and the drain electrode 206 are connected to a data signal wiring. In the case where the gate signal wiring and/or the data signal wiring are formed as part of a conductive layer pattern 200 (see FIGS. 3A, 3B, 4A, 4B), the gate signal wiring and the data signal wiring may be formed to be separated from each other in a position where the gate signal wiring and the data signal wiring would intersect each other. In other words, one of the gate signal wiring and the data signal wiring is disconnected in a position where the gate signal wiring and the data signal wiring would intersect each other to transmit a gate signal and a data signal through the gate signal wiring and the data signal wiring, respectively. In this case, an insulating layer having a contact hole is laminated in the position where the gate signal wiring and the data signal wiring would intersect each other, and a signal wiring may be connected to each other by a metal pattern on the insulating layer. The insulating layer should be formed concurrently (e.g., simultaneously) with an insulating layer 400 that will be described below.

The insulating layer 400 is located in the dented portion, and may be formed by using a variety of suitable materials such as an inorganic material, e.g., silicon oxide or silicon nitride; or an organic material, e.g., polyvinylpyrrolidone, polystyrene, styrene-butadiene copolymers, polyvinylphenol, or polyphenol. The insulating layer 400 may be formed by inkjet printing, chemical vapor deposition, or the like.

The semiconductor layer 500 may be an organic semiconductor or an oxide semiconductor which can be formed by a solution process.

The organic semiconductor may be formed of a material containing at least one of a 2,9-dialkyldinaphtho[2,3-b:2',3'-f]thieno[3,2-b]thiophenes(Cn-DNTT) derivative, a [1]benzothieno[3,2-b]benzothiophene(BTBT) derivative, TIPS-pentacene, TES-ADT and its derivatives, a perylene derivative, TCNQ, F4-TCNQ, F4-TCNQ, rubrene, pentacene, p3HT, pBTTT, and pDA2T-C16. For example, the 2,9-dialkyldinaphtho[2,3-b:2',3'-f]thieno[3,2-b]thiophenes(Cn-DNTT) derivative and the [1]benzothieno[3,2-b]benzothiophene(BTBT) derivative may be formed of $C_{10}$-DNTT and $C_8$-BTBT, respectively.

The organic semiconductor may be formed of a suitable organic semiconductor material such as pentacene, tetracene, anthracene, naphthalene, α-6T, α-4T, perylene or its derivatives, rubrene or its derivatives, coronene or its derivatives, perylene tetracarboxylic diimide or its derivatives, perylene-tetracarboxylic dianhydride or its derivatives, phthalocyanine or its derivatives, naphthalene tetracarboxylic diimide or its derivatives, naphthalene tetracarboxylic dianhydride or its derivatives, derivatives of conjugated polymers containing substituted or non-substituted thiophenes, derivatives of conjugated polymers containing substituted fluorenes, or the like.

Further, as can be seen from the embodiments of the present invention, the semiconductor layer 500 may include amorphous silicon or oxide semiconductor that has a pattern formed by a photolithography process.

The oxide semiconductor may contain any one of the oxides based on titanium (Ti), hafnium (Hf), zirconium (Zr), aluminum (Al), tantalum (Ta), germanium (Ge), zinc (Zn), gallium (Ga), tin (Sn), indium (In), and composite oxides thereof. For example, the oxide semiconductor may contain zinc oxide (ZnO), indium gallium zinc oxide (InGaZnO$_4$), indium zinc oxide (Zn—In—O), zinc tin oxide (Zn—Sn—O), indium gallium oxide (In—Ga—O), indium tin oxide (In—Sn—O), indium zirconium oxide (In—Zr—O), indium zirconium zinc oxide (In—Zr—Zn—O), indium zirconium tin oxide (In—Zr—Sn—O), indium zirconium gallium oxide (In—Zr—Ga—O), indium aluminum oxide (In—Al—O), indium zinc aluminum oxide (In—Zn—Al—O), indium tin aluminum oxide (In—Sn—Al—O), indium aluminum gallium oxide (In—Al—Ga—O), indium tantalum oxide (In—Ta—O), indium tantalum zinc oxide (In—Ta—Zn—O), indium tantalum tin oxide (In—Ta—Sn—O), indium tantalum gallium oxide (In—Ta—Ga—O), indium germanium oxide (In—Ge—O), indium germanium zinc oxide (In—Ge—Zn—O), indium germanium tin oxide (In—Ge—Sn—O), indium germanium gallium oxide (In—Ge—Ga—O), titanium indium zinc oxide (Ti—In—Zn—O), or hafnium indium zinc oxide (Hf—In—Zn—O).

The source electrode 204 and the drain electrode 206 are located on the substrate 100, and are formed of the same material as the gate electrode 202. Cross sections of the source electrode 204 and the drain electrode 206 are in contact with the semiconductor layer 500 so as to form a channel. In FIG. 1, the semiconductor layer 500 is in contact with the cross sections of the source electrode 204 and the drain electrode 206, but it is not limited thereto. In order to increase the contact area, the semiconductor layer 500 may be extended to upper surfaces of the source electrode 204 and the drain electrode 206, which are adjacent to the cross sections of the source electrode 204 and the drain electrode 206.

Figure 2A:
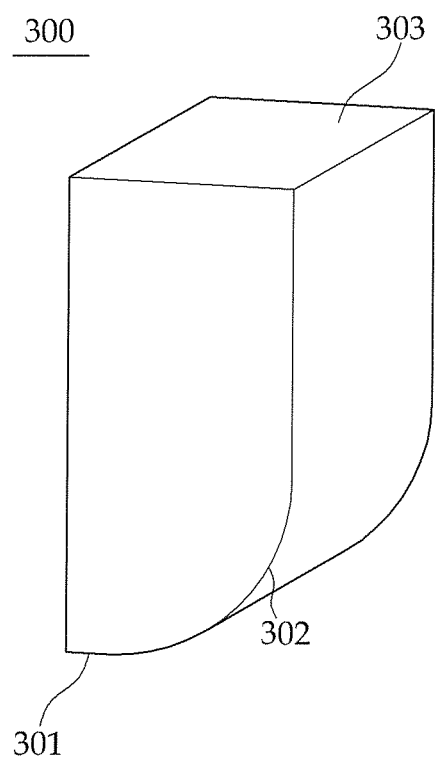
FIGS. 2A to 2C are diagrams illustrating a structure of a pressing mold according to an embodiment of the present invention.

FIG. 2A illustrates a shape of a pressing mold 300 according to an embodiment of the present invention. As illustrated in FIG. 2A, the pressing mold 300 may include a protrusion 301 for forming a dented portion by denting a substrate and a conductive layer pattern, an inclined portion 302 coupled to the protrusion 301, and a top surface 303.

Figure 2B:
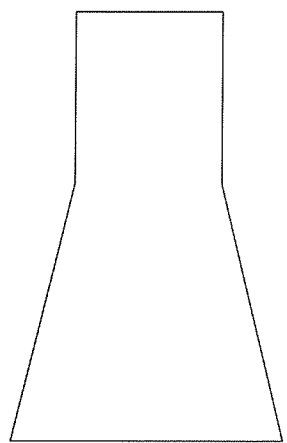
Figure 2C:
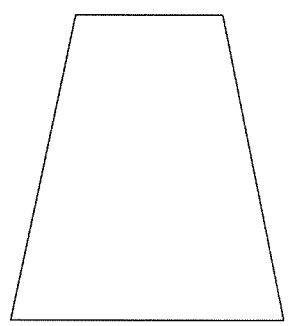

FIGS. 2B and 2C illustrate top surfaces of a pressing mold 300, respectively according to other embodiments of the present invention.

Referring to FIGS. 2B and 2C, the top surfaces of the pressing mold 300 may have a one side widened shape (i.e., a shape with one side widened). For example, upper and lower cross sections of the pressing mold 300 may have a one side widened shape such as a trapezoid (see FIG. 2C) or a conical body with a cylindrical neck (see FIG. 2B).

Figure 3A:
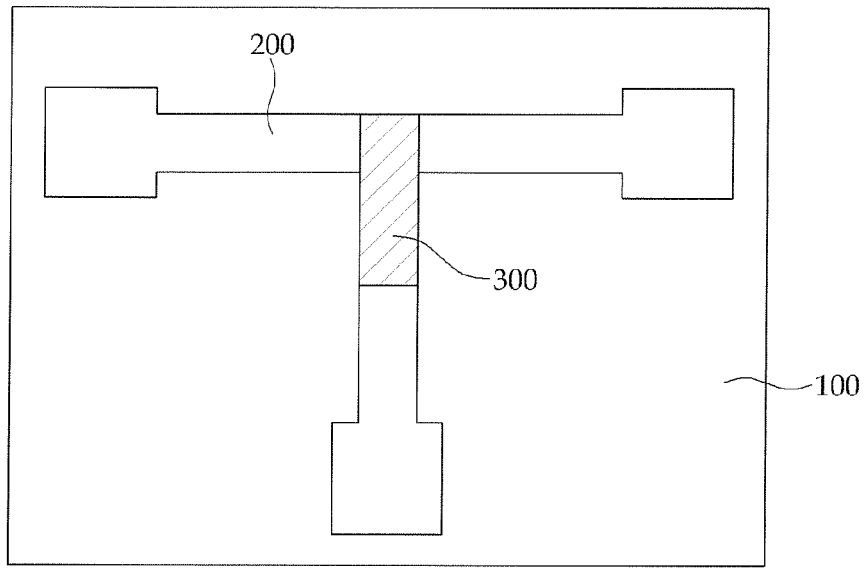
FIGS. 3A and 3B are diagrams showing a top surface in forming of a dented portion at a conductive layer pattern using a pressing mold illustrated in FIGS. 2A and 2B.
Figure 3B:
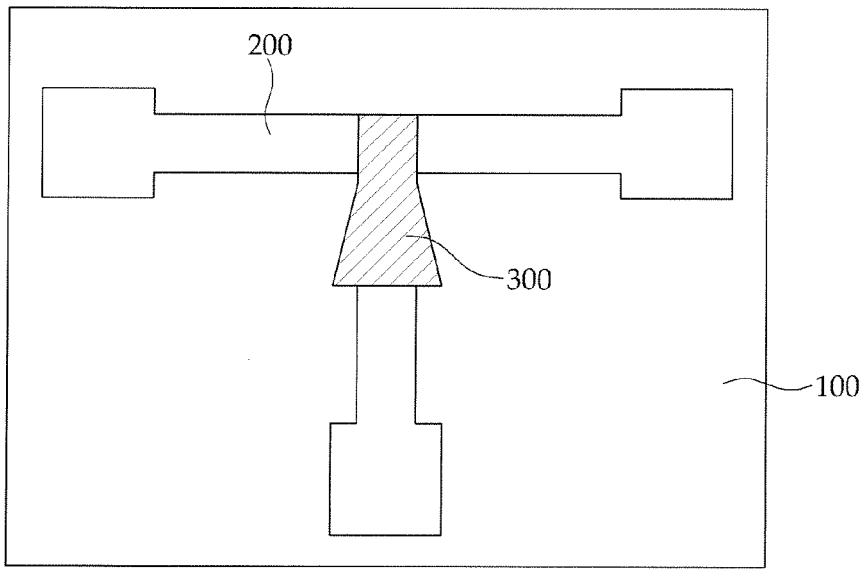

FIGS. 3A and 3B illustrate top surfaces respectively in forming of a dented portion in the conductive layer pattern by using the pressing mold 300 illustrated in FIGS. 2A and 2B.

Referring to FIG. 3A, the conductive layer pattern 200 deposited on the substrate 100 is pressed by the pressing mold 300 having the shape illustrated in FIG. 2A.

In general, a gate electrode needs to be connected to an external wiring in electronic devices. As illustrated in FIGS. 3A and 3B, the gate electrode formed at the dented portion by using the shape of the pressing mold 300 may be connected to the conductive layer pattern which is not pressed without being disconnected according to an embodiment of the present invention.

FIG. 3B illustrates a top surface in forming of a dented portion in a conductive layer pattern by using the pressing mold 300 illustrated in FIG. 2B.

As illustrated in FIG. 3B, in the case where the pressing mold 300 of which upper and lower cross sections have gradually widening shapes is pressed by the same force, pressure applied to the conductive layer pattern varies depending on location, and thus the conductive layer pattern has dented portions of different depths. In other words, the conductive layer pattern dented by a part with a small cross-sectional area of the pressing mold 300 has a greater depth than the conductive layer pattern dented by a part with a larger cross-sectional area. Due to such a difference in a dented depth, the conductive layer pattern of the dented portion and the non-dented portion may be formed to be connected to each other without being disconnected.

FIGS. 4A to 4E are perspective views for illustrating a manufacturing method of an electronic device according to a first embodiment of the present invention.

Figure 4A:
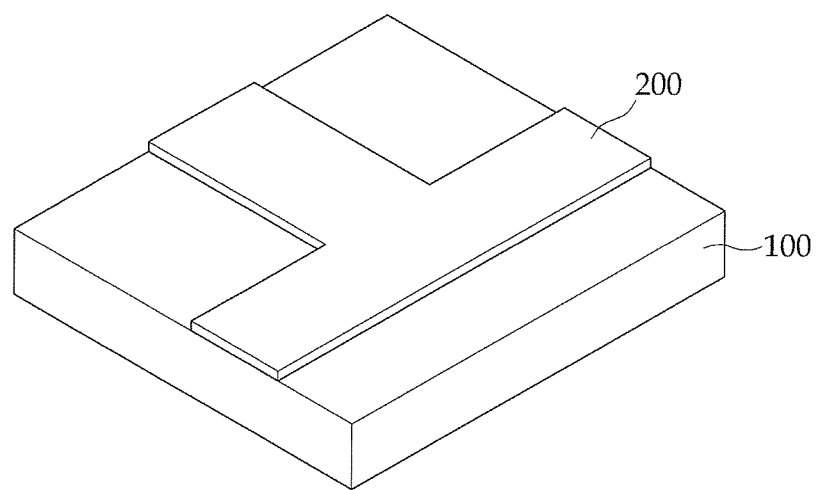
FIGS. 4A to 4E are perspective views for illustrating a manufacturing method of an electronic device according to a first embodiment of the present invention.

First, as illustrated in FIG. 4A, a conductive layer pattern 200 is formed on a substrate 100. The conductive layer pattern 200 may be formed by screen printing, etc.

Figure 4B:
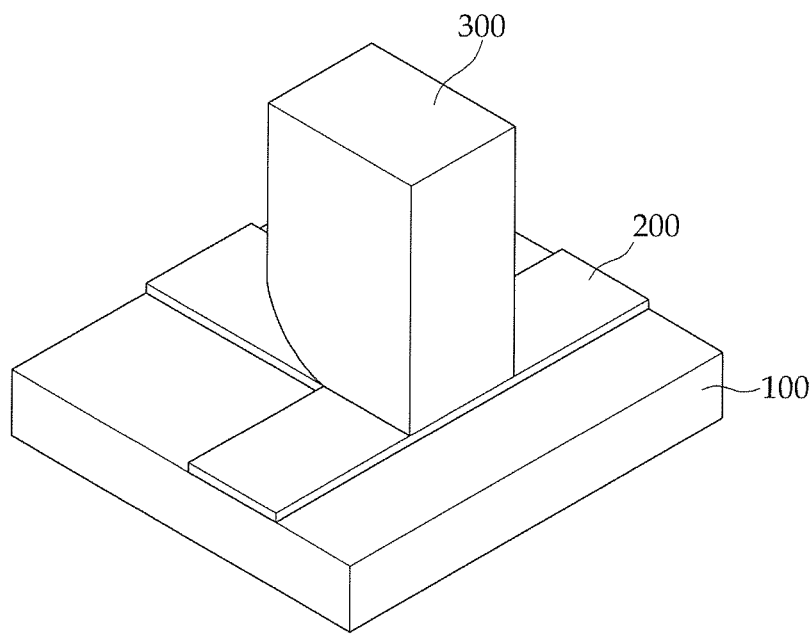

Next, as illustrated in FIG. 4B, a pressing mold 300 is located on the conductive layer pattern 200 to press the conductive layer pattern 200. Here, a plane shape of a protrusion of the pressing mold 300 is identical to that of a semiconductor layer to be formed. The pressing mold 300 has a vertical surface and an inclined surface as described above. The inclined surface may include a flat surface or a curved surface.

Figure 4C:
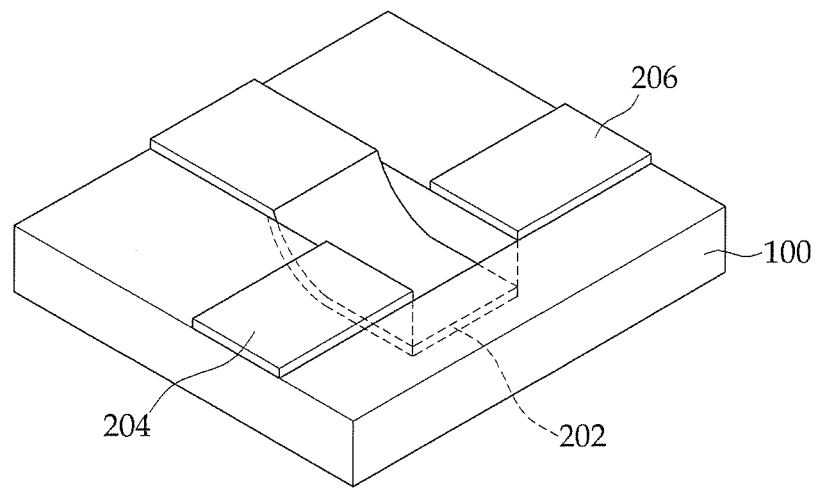

As illustrated in FIG. 4C, if the pressing mold 300 is removed from the conductive layer pattern 200, a dented portion having the same shape as the protrusion is formed, and then the conductive layer pattern 200 is separated into a gate electrode 202, a source electrode 204, and a drain electrode 206. In other words, the dented portion has a depth which is equal to a thickness of the protrusion of the pressing mold 300, and the dented portion includes a vertical surface and an inclined surface.

Figure 4D:
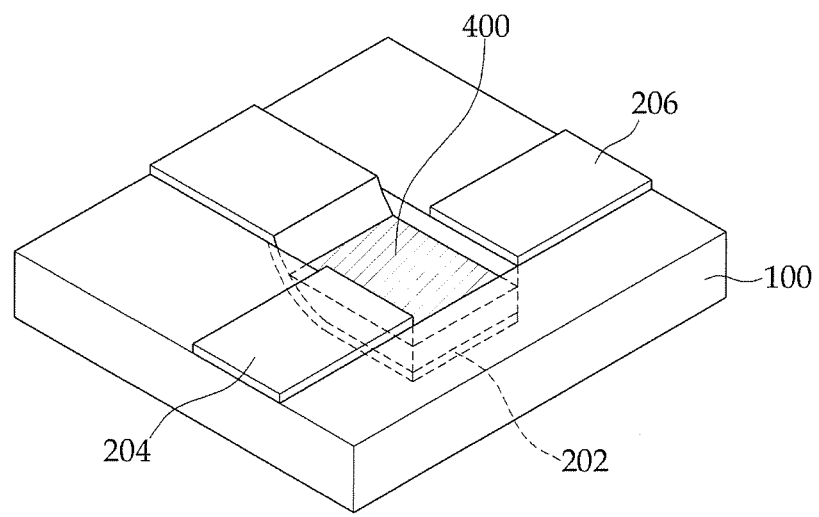

Next, as illustrated in FIG. 4D, an insulating layer 400 is formed on the gate electrode 202 in the dented portion. The insulating layer 400, as a gate insulating layer, may be formed by an inkjet process, and may be formed of an inorganic insulating material or an organic insulating material. The insulating layer can be formed of any suitable material available in a solution form that is suitable for the inkjet process.

As can be seen from the second, third, sixth, and eighth embodiments of the present invention, which will be described below in more detail, the insulating layer 400 may be formed by being fully coated with an inorganic insulating material or an organic insulating material before the gate electrode 202, the source electrode 204, and the drain electrode 206 are formed by pressing the conductive layer pattern 200 using the pressing mold 300.

Figure 4E:
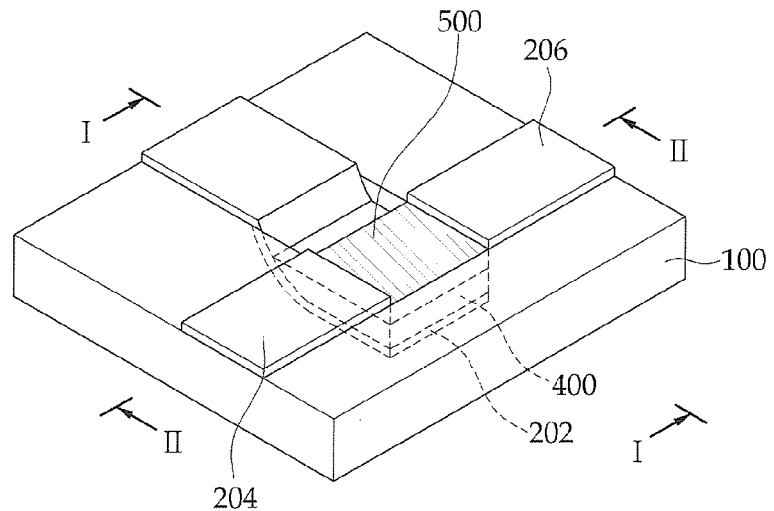
Figure 5:
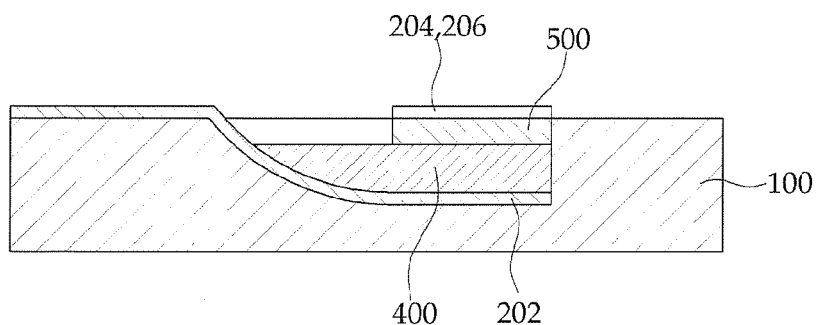
FIGS. 5 and 6 are cross-sectional views taken along dotted lines I-I and II-II in FIG. 4E.
Figure 6:
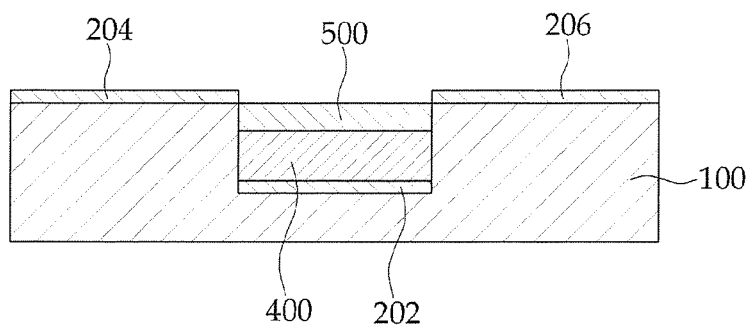

Next, as illustrated in FIG. 4E, a semiconductor layer 500 is formed on the insulating layer 400 by an inkjet process. Any suitable material such as an organic semiconductor can be used for the semiconductor layer 500 if it can be in the form of a solution suitable for the inkjet process. FIGS. 5 and 6 are cross-sectional views taken along dotted lines I-I and II-II in FIG. 4E, respectively.

FIGS. 7A to 7E are schematic cross-sectional views for illustrating a manufacturing method of an electronic device according to a first embodiment of the present invention.

Figure 7A:
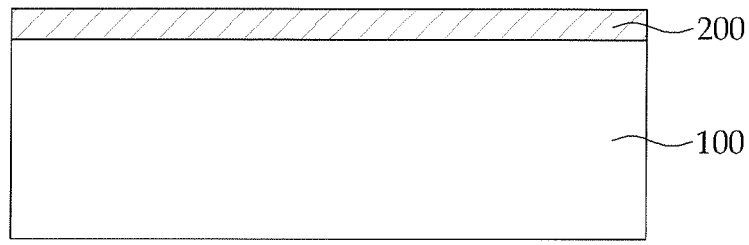
FIGS. 7A to 7E are schematic cross-sectional views for illustrating a manufacturing method of an electronic device according to a first embodiment of the present invention.

First, referring to FIG. 7A, a conductive layer pattern 200 is formed on a substrate 100 by using a deposition method such as sputtering.

Here, the substrate 100 may include silicon single crystal, transparent glass, transparent plastic, or the like. In the case of a p-type transistor, a substrate doped with n-type ions is used as the substrate 100. In an embodiment of the present invention, a plastic substrate such as PET, PES, PI, PEN, PC, or the like, may be used as the substrate 100. In addition, the conductive layer pattern 200 may be a monomolecular semiconductor material or a polymer semiconductor material, and for example, may include metal, graphene, and/or the like.

Figure 7B:
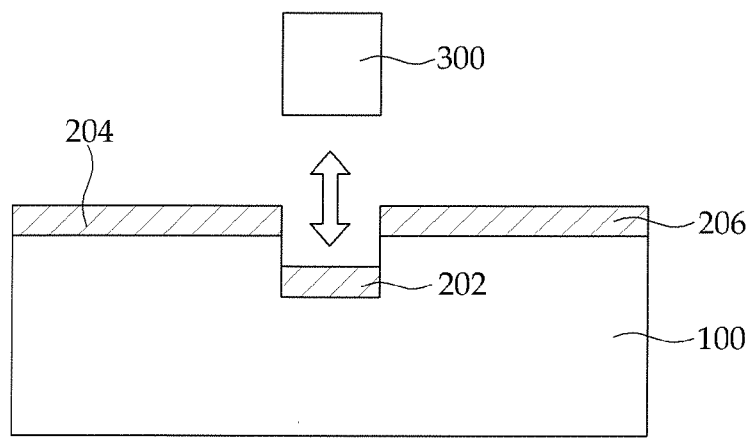

Next, referring to FIG. 7B, a part of the conductive layer pattern 200 is pressed by using a pressing mold 300 and the conductive layer pattern 200 is dented to form a dented portion.

Here, an example of the pressing mold 300 may include an imprint mold and in one embodiment, may include a hot-embossing imprinting mold. A temperature of the pressing mold for denting the substrate may be in the range of about 50° C. to about 150° C. Further, pressure at which the pressing mold presses the substrate may be about 200 kgf/cm$^2$ to about 500 kgf/cm$^2$, and an imprinting velocity of the pressing mold may be about 1 mm/s to about 100 mm/s.

The pressing mold 300 may have the same shape as the dented portion. In an embodiment of the present invention, the pressing mold has a shape that (when pressed into conductive patterns that are connected to each other) causes the dented conductive layer pattern (the gate electrode 202) and the non-dented conductive layer patterns (the source electrode 204 and the drain electrode 206) to be electrically isolated from each other.

Figure 7C:
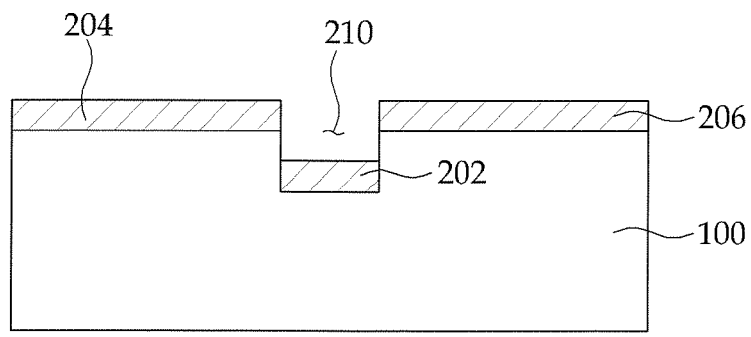

Next, referring to FIG. 7C, a center region and two side regions are divided by forming the dented portion 210 by using the pressing mold 300. Here, the center region corresponding to the dented portion 210 is defined as a gate electrode 202, and respective side regions with respect to the dented portion are defined as a source electrode 204 and a drain electrode 206.

Figure 7D:
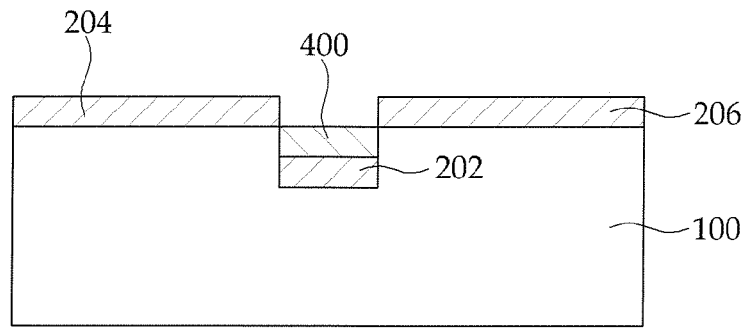

Next, referring to FIG. 7D, an insulating layer 400 is formed on the dented portion. The insulating layer 400 refers to a gate insulating layer, and a suitable material of the insulating layer 400 may include an inorganic material such as tetraethyl orthosilicate (TEOS) or an organic material such as polyimide or acrylate. In this case, the insulating layer 400 on the dented portion may be formed by a jetting method such as an inkjet method or an electro-hydro-dynamic (EHD) method. As such, the gate electrode 202, the source electrode 204, and the drain electrode 206 are separated by the insulating layer 400 formed at the dented portion, respectively.

Figure 7E:
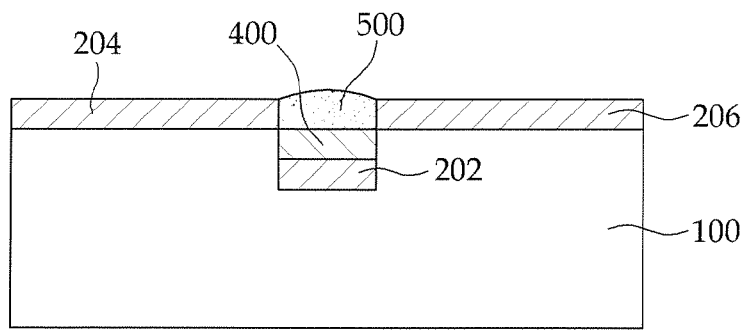

Next, referring to FIG. 7E, the semiconductor layer 500 is formed on the insulating layer 400 by using a material suitable for forming the semiconductor layer.

The material suitable for forming the semiconductor layer may include polythienylenevinylene, poly-2-hexylthiophene (poly-3-hexylthiophene), polythiophene, phthalocyanine, metalized phthalocyanine, or a halogenated derivative thereof; perylenetetracarboxylic dianhydride (NTCDA) or an imide derivative thereof; or perylene, coronene, or a derivative containing a substituent thereof.

In the same manner as the method of forming the insulating layer 400, a method of forming the semiconductor layer 500 may include coating the suitable material for forming the semiconductor layer on the insulating layer 400 or a jetting method such as an inkjet method or an electro-hydro-dynamic (EHD) method. Here, the semiconductor layer 500 is formed to be in contact with the source electrode 204 and the drain electrode 206.

FIGS. 8A to 8D are schematic cross-sectional views for illustrating a manufacturing method of an electronic device according to a second embodiment of the present invention.

The manufacturing method of an electronic device according to the second embodiment of the present invention is performed in substantially the same manner as the manufacturing method according to the first embodiment described above, except for performing the forming of the insulating layer 400 prior to the forming of the dented portion.

Figure 8A:
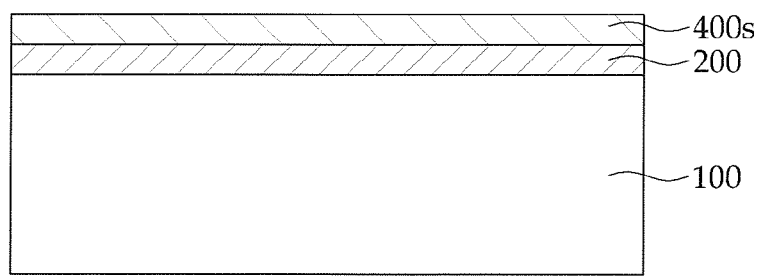
FIGS. 8A to 8D are schematic cross-sectional views for illustrating a manufacturing method of an electronic device according to a second embodiment of the present invention.

First, as illustrated in FIG. 8A, a conductive layer pattern 200 is formed on a substrate 100 by using a deposition method such as sputtering, and an insulating layer 400s is formed to be fully coated on the conductive layer pattern 200.

Figure 8B:
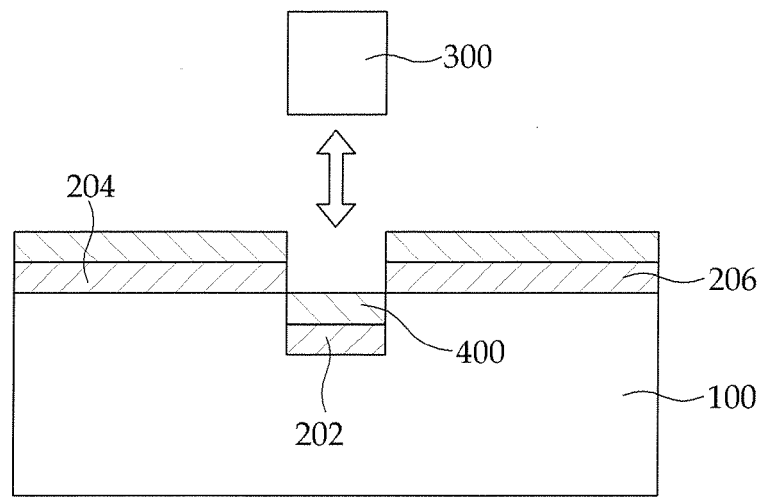

Next, as illustrated in FIG. 8B, a part of the insulating layer 400s is pressed by a pressing mold 300 and dented to form a dented portion, and thus has a form divided into a center region and two side regions.

Figure 8C:
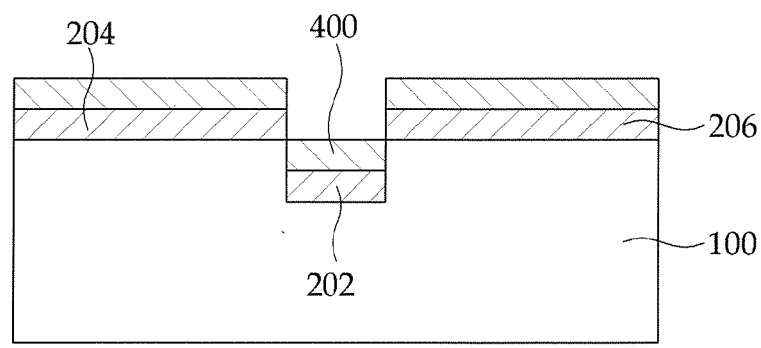

Here, as illustrated in FIG. 8C, the center region corresponding to the dented portion is defined as a gate electrode 202, and respective side regions with respect to the dented portion are defined as a source electrode 204 and a drain electrode 206 to, e.g., concurrently or simultaneously form the final insulating layer 400 with the gate electrode 202, the drain electrode 206, and the source electrode 204.

Figure 8D:
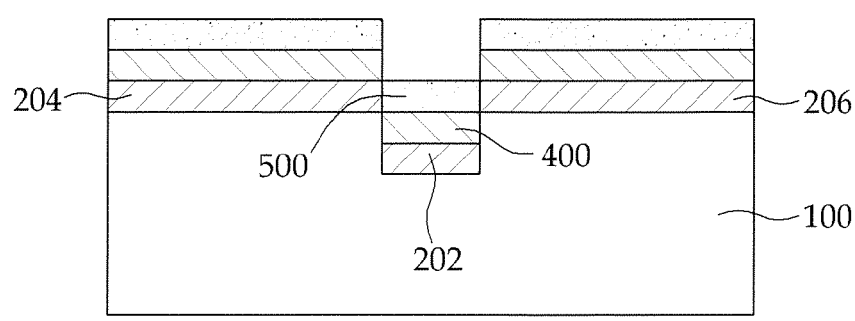

Next, as illustrated in FIG. 8D, a semiconductor layer 500 is formed on the insulating layer 400 disposed at the dented portion by using a suitable material for forming the semiconductor layer. In this case, the semiconductor layer 500 is formed to be in contact with the source electrode 204 and the drain electrode 206.

Figure 9A:
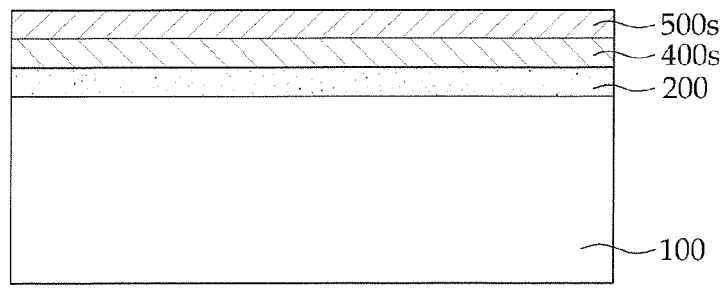
FIGS. 9A to 9C are schematic cross-sectional views for illustrating a manufacturing method of an electronic device according to a third embodiment of the present invention.
Figure 9B:
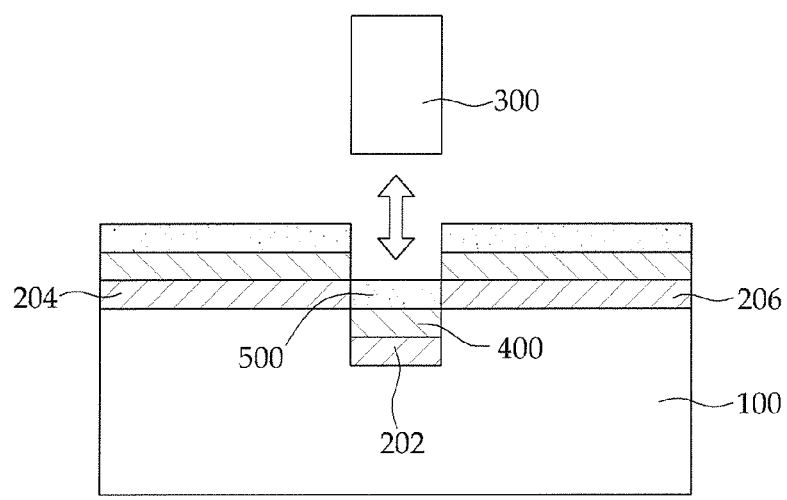
Figure 9C:
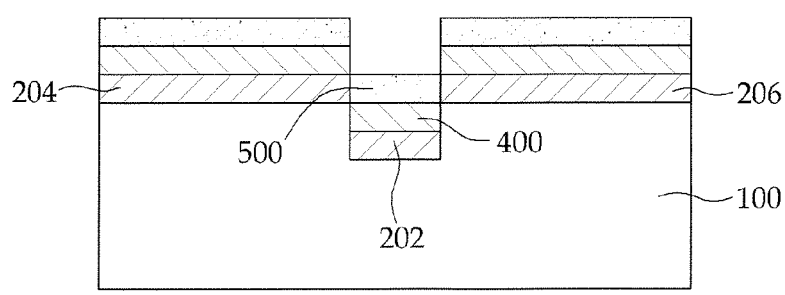

FIGS. 9A to 9C are schematic cross-sectional views for illustrating a manufacturing method of an electronic device according to a third embodiment of the present invention.

The manufacturing method of an electronic device according to the third embodiment of the present invention is performed in substantially the same manner as the manufacturing method according to the first embodiment described above, except for performing the forming of the insulating layer 400 and the semiconductor layer 500 prior to the forming of the dented portion.

First, a conductive layer pattern 200 is formed on a substrate 100 by using a deposition method such as sputtering, and after the insulating layer 400s is formed to be coated on the conductive layer pattern 200, the semiconductor layer 500s is formed to be coated on the insulating layer 400s (see FIG. 9A).

Next, a part of the semiconductor layer 500s is pressed by a pressing mold 300 and dented to form a dented portion (see FIG. 9B).

Next, by forming the dented portion by using the pressing mold 300, the gate electrode 202, the insulating layer 400, and the semiconductor layer 500 are formed in the center region, and the source electrode 204 and the drain electrode 206 are formed in the two side regions with respect to the dented portion. In this case, the semiconductor layer 500 is in contact with the source electrode 204 and the drain electrode 206 to form a channel (see FIG. 9C).

FIGS. 10A to 10D are schematic cross-sectional views for illustrating a manufacturing method of an electronic device according to a fourth embodiment of the present invention.

The manufacturing method of an electronic device according to the fourth embodiment of the present invention is performed in substantially the same manner as the manufacturing method according to the first embodiment described above, except for the forming of the insulating layer 400.

Figure 10A:
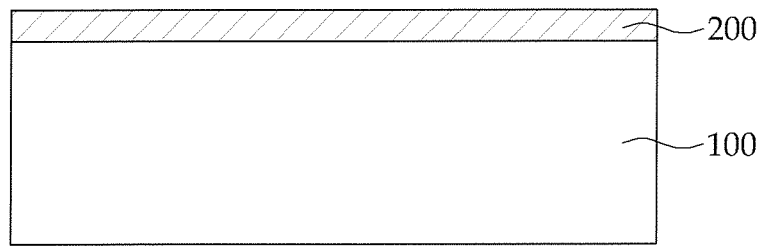
FIGS. 10A to 10D are schematic cross-sectional views for illustrating a manufacturing method of an electronic device according to a fourth embodiment of the present invention.

First, referring to FIG. 10A, a conductive layer pattern 200 is formed on a substrate 100 by using a deposition method such as sputtering.

Figure 10B:
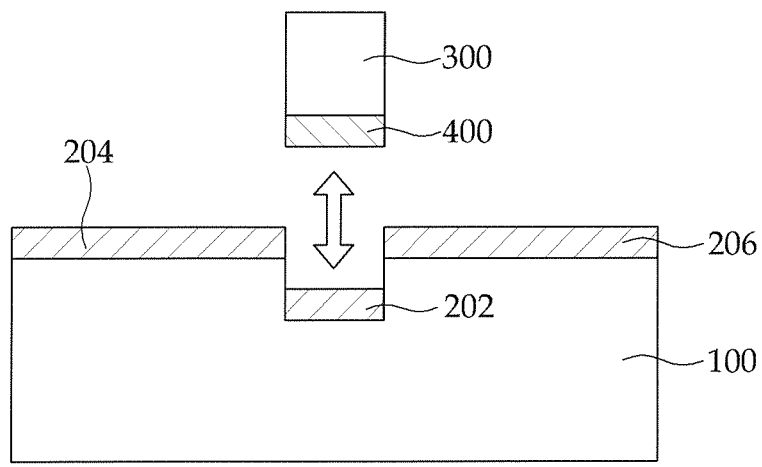

Next, referring to FIG. 10B, the conductive layer pattern 200 is pressed by using a pressing mold 300 and dented to form a dented portion, and is divided into a gate electrode 202, a source electrode 204, and a drain electrode 206, and concurrently the insulating layer 400 coated on a contact surface between the conductive layer pattern 200 and the pressing mold 300 is transferred to the gate electrode 202.

Figure 10C:
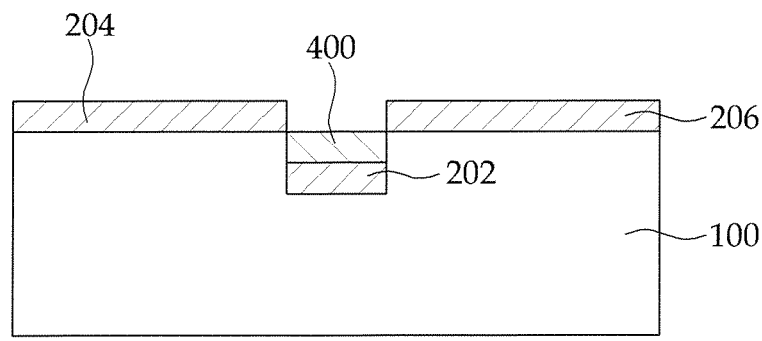

Referring to FIG. 10C, a center region to which the insulating layer 400 is transferred and two side regions are separated by forming the dented portion by using the pressing device (e.g., a pressing mold 300), respectively. In this case, the center region corresponding to the dented portion is defined as a gate electrode 202, and the side regions with respect to the dented portion are defined as a source electrode 204 and a drain electrode 206, respectively.

Figure 10D:
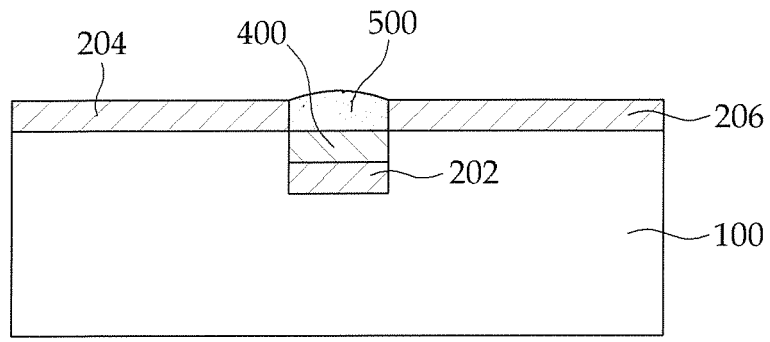

Next, referring to FIG. 10D, a semiconductor layer 500 is formed on the insulating layer 400 disposed at the dented portion by using a suitable material for forming the semiconductor layer. In this case, the semiconductor layer 500 is in contact with the source electrode 204 and a drain electrode 206 to form a channel.

FIGS. 11A to 11F are schematic cross-sectional views for illustrating a manufacturing method of an electronic device according to a fifth embodiment of the present invention.

As illustrated in FIGS. 11A to 11F, the manufacturing method of an electronic device according to the fifth embodiment of the present invention is performed in substantially the same manner as the manufacturing method according to the first embodiment described above, except for the forming of the semiconductor layer 500.

Figure 11A:
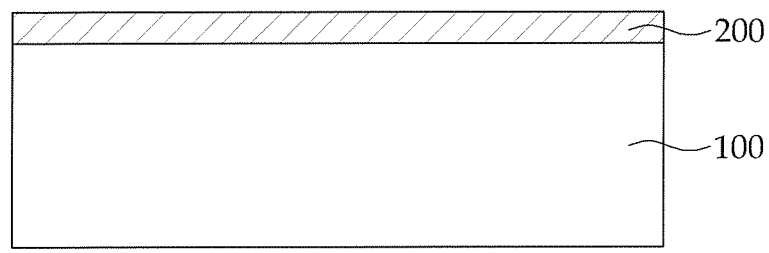
FIGS. 11A to 11F are schematic cross-sectional views for illustrating a manufacturing method of an electronic device according to a fifth embodiment of the present invention.
Figure 11B:
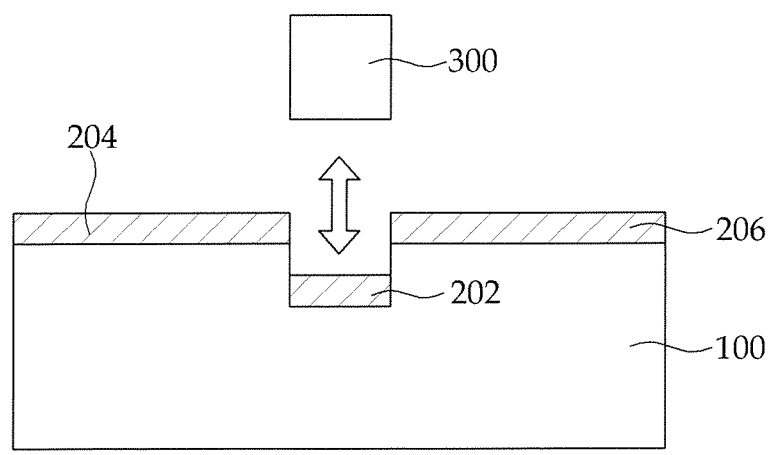
Figure 11C:
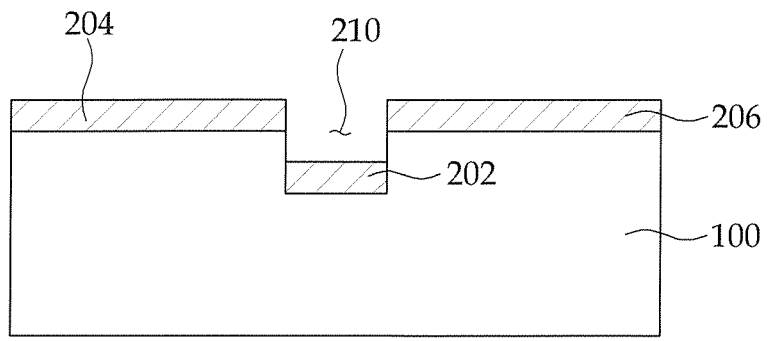
Figure 11D:
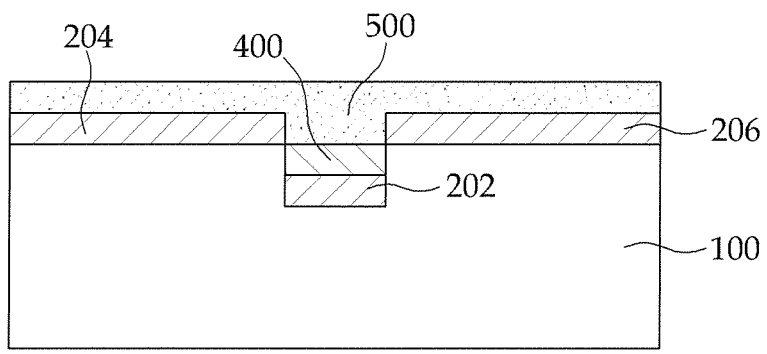
Figure 11E:
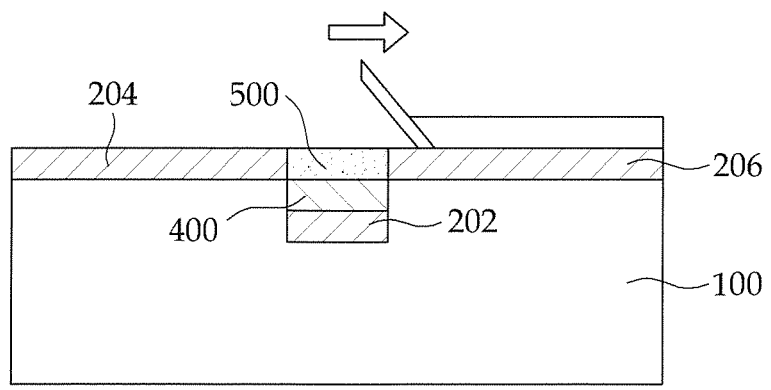
Figure 11F:
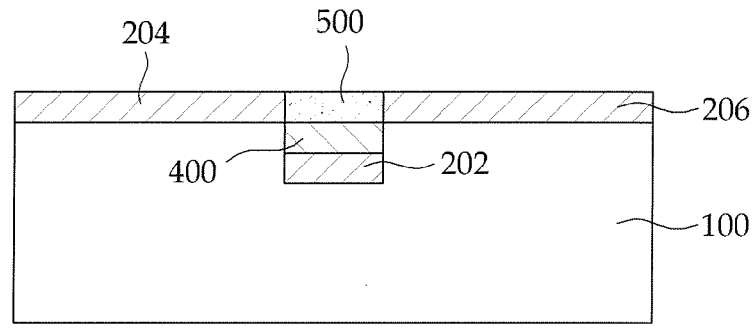

In more detail, referring to FIGS. 11D and 11E, the forming of the semiconductor layer 500 includes coating a suitable material for forming the semiconductor layer on the entirety of the substrate 100 including the insulating layer 400 disposed at the dented portion (see FIG. 11D), and removing the material for forming the semiconductor layer coated on the non-dented portion of the substrate 100 (see FIG. 11E).

The coating of the suitable material for forming the semiconductor layer (see FIG. 11D) may be performed by using a printing method, for example, inkjet printing, spin coating, bar coating, gravure printing, or the like. Here, the semiconductor layer 500 is in contact with the source electrode 204 and the drain electrode 206 to form a channel.

FIGS. 12A to 12F are schematic cross-sectional views for illustrating a manufacturing method of an electronic device according to a sixth embodiment of the present invention.

As illustrated in FIGS. 12A to 12F, the manufacturing method of an electronic device according to the sixth embodiment of the present invention is performed in substantially the same manner as the manufacturing method according to the second embodiment described above, except for the forming of the semiconductor layer 500.

Figure 12A:
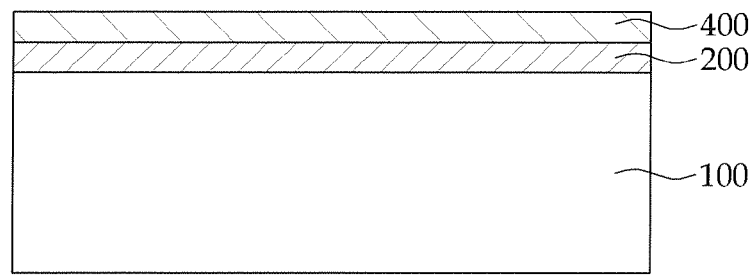
FIGS. 12A to 12F are schematic cross-sectional views for illustrating a manufacturing method of an electronic device according to a sixth embodiment of the present invention.
Figure 12B:
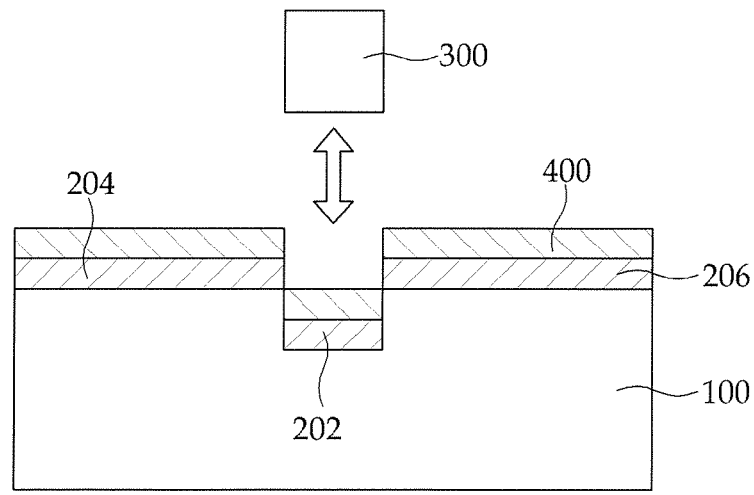
Figure 12C:
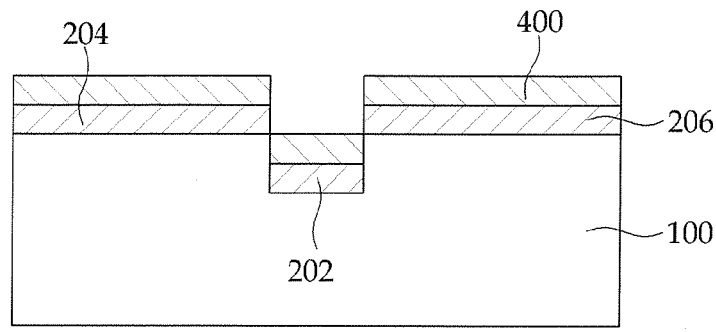
Figure 12D:
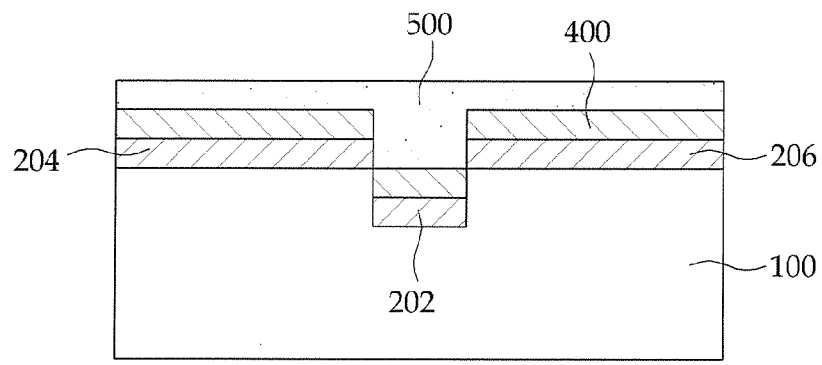
Figure 12E:
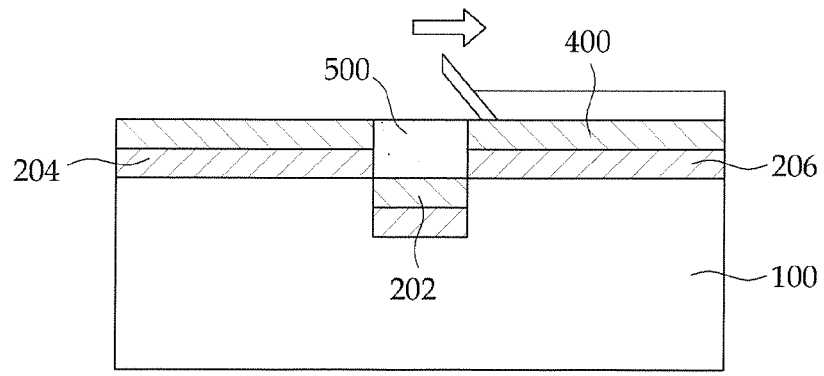
Figure 12F:
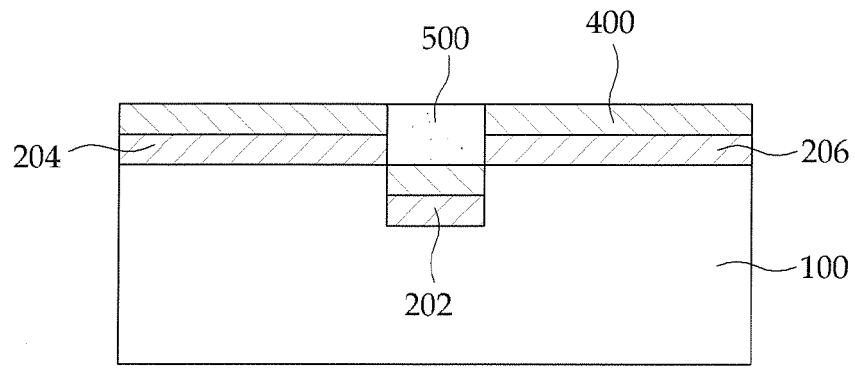

In more detail, referring to FIGS. 12D and 12E, the forming of the semiconductor layer 500 includes coating a suitable material for forming the semiconductor layer throughout an upper portion (i.e., an upper surface) of the insulating layer 400 disposed at both the dented portion and the non-dented portions of a source electrode 204 and a drain electrode 206 (see FIG. 12D), and removing the material for forming the semiconductor layer coated on the non-dented portions of the substrate (see FIG. 12E). Here, the semiconductor layer 500 is in contact with the source electrode 204 and the drain electrode 206 to form a channel.

Referring to FIG. 12E, particularly in the removing of the material for forming the semiconductor layer from the nondented portions, there is a difference in the manufacturing method of an electronic device between the fifth embodiment and the sixth embodiment in that the material for forming the semiconductor layer is removed while the insulating layer 400 disposed at the non-dented portions still remains.

FIGS. 13A to 13F are schematic cross-sectional views for illustrating a manufacturing method of an electronic device according to a seventh embodiment of the present invention.

As illustrated in FIGS. 13A to 13F, the manufacturing method of an electronic device according to the seventh embodiment is performed in substantially the same manner as the manufacturing method according to the fourth embodiment described above, except for the forming of the semiconductor layer 500.

Figure 13A:
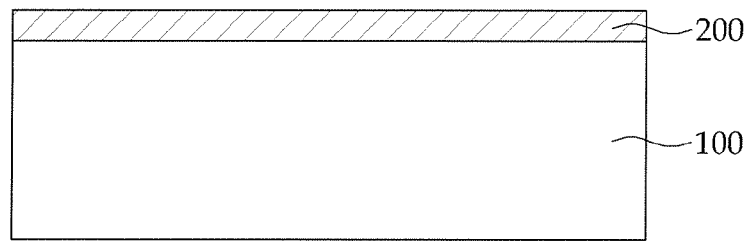
FIGS. 13A to 13F are schematic cross-sectional views for illustrating a manufacturing method of an electronic device according to a seventh embodiment of the present invention.
Figure 13B:
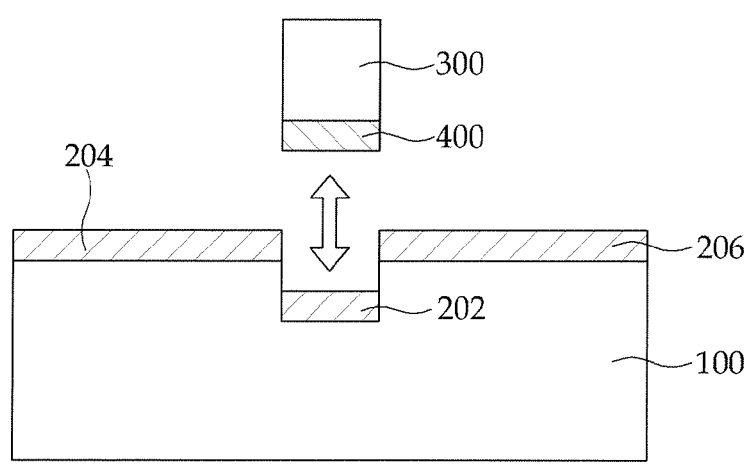
Figure 13C:
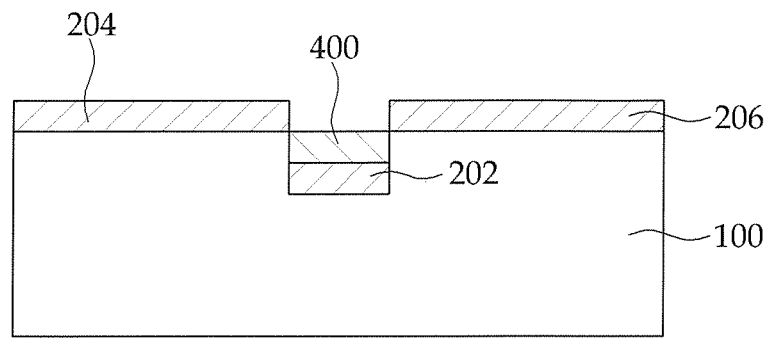
Figure 13D:
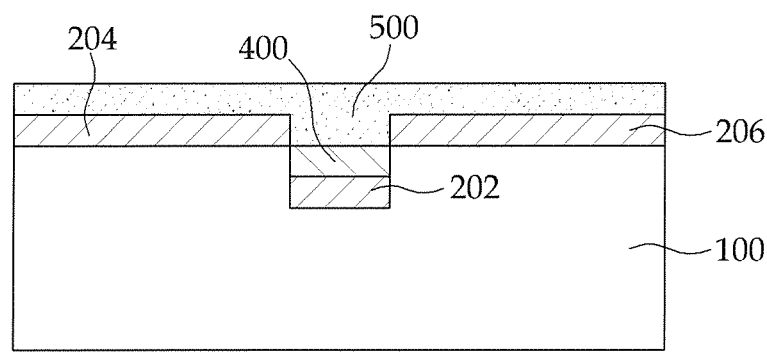
Figure 13E:
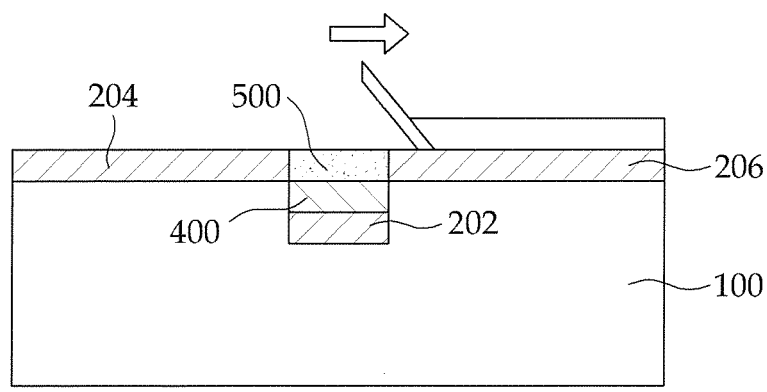
Figure 13F:
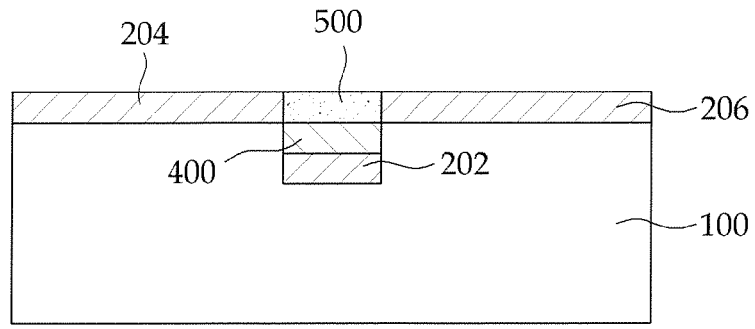

In more detail, referring to FIGS. 13D and 13E, the forming of the semiconductor layer 500 includes coating a suitable material for forming the semiconductor layer 500 on the entirety of the substrate 100 including the insulating layer 400 disposed at the dented portion (see FIG. 13D), and removing the material for forming the semiconductor layer from the portion which is not dented (see FIG. 13E).

As described above, in accordance with the manufacturing method according to the first to seventh embodiments of the present invention, a bottom-gate electronic device may be manufactured, which includes the gate electrode formed at the dented portion and the source electrode and the drain electrode formed at non-dented portion of the substrate.

Further, according to an eighth embodiment of the present invention, which will be described below, a top-gate electronic device may be manufactured, which includes the source electrode 204 and the drain electrode 206 formed at the dented portion and the gate electrode 202 formed at the non-dented portion of the substrate.

Figure 14A:
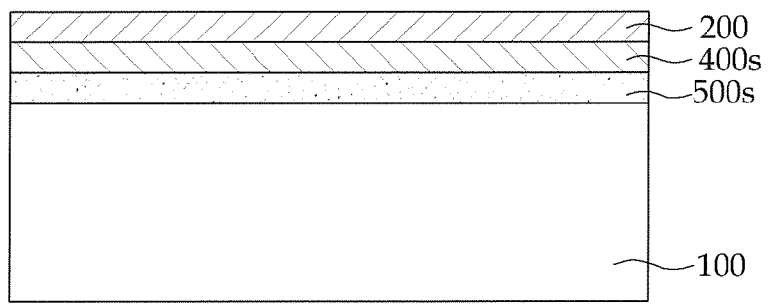
FIGS. 14A to 14C are schematic cross-sectional views for illustrating a manufacturing method of an electronic device according to an eighth embodiment of the present invention.
Figure 14B:
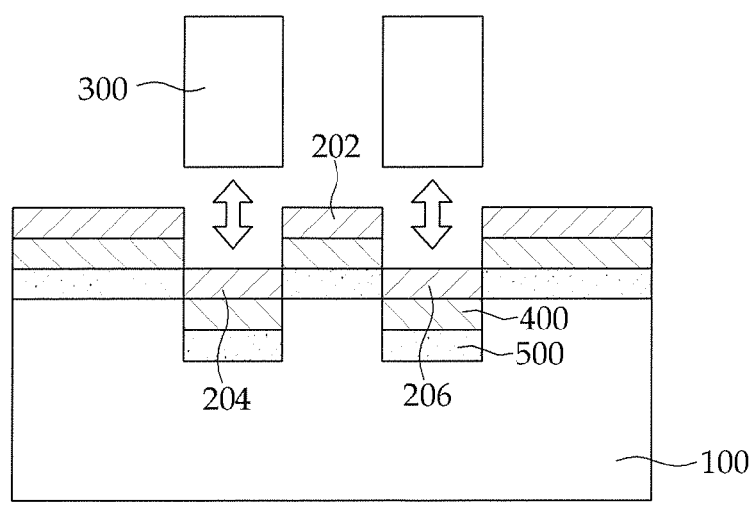
Figure 14C:
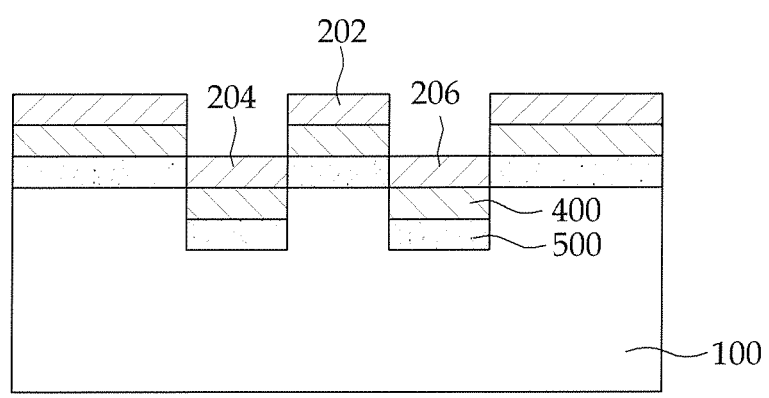

FIGS. 14A to 14C are schematic cross-sectional views for illustrating a manufacturing method of an electronic device according to the eighth embodiment of the present invention.

First, a semiconductor layer 500s is coated on the substrate 100 by using a deposition method such as sputtering, and after an insulating layer 400s is coated on the semiconductor layer 500s, a conductive layer pattern 200 is formed on the insulating layer 400s (see FIG. 14A).

Next, a part of the conductive layer pattern 200 is pressed by two pressing molds 300 and dented to form a first dented portion and a second dented portion (see FIG. 14B).

Next, by forming the first dented portion and the second dented portion by using the pressing mold 300, the source electrode 204 and the drain electrode 206 are formed at the first dented portion and the second dented portion, respectively, and the gate electrode 202 is formed in the center region which is not dented between the first dented portion and the second dented portion. In this case, the semiconductor layer 500, which is located between the source electrode 204 and the drain electrode 206, is in contact with the source electrode 204 and the drain electrode 206 so as to form a channel, and the insulating layer 400 is located between the semiconductor layer 500 and the gate electrode 202 (see FIG. 14C).

As illustrated in FIG. 14C, a thin film transistor manufactured according to the eighth embodiment of the present invention includes a substrate 100 having two dented portions; a source electrode 204 and a drain electrode 206 formed respectively at the two dented portions; a gate electrode 202 formed at the non-dented portion of the substrate; an insulating layer 400 located between the source electrode 204 and the drain electrode 206 formed at the dented portions and the gate electrode 202 formed at non-dented portion of the substrate; and a semiconductor layer 500 connected to the source electrode 204 and the drain electrode 206.

In the related art, a plurality of processes are required in order to form the source electrode, the drain electrode, and the gate electrode, but according to embodiments of the present invention, it is possible to simplify the manufacturing process and reduce manufacturing costs and the processing time because the insulating layer, the gate electrode, the source electrode, and the drain electrode may be formed through a simple process by using the pressing mold 300.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the scope and spirit being indicated by the following claims and their equivalents.

What is claimed is:

1. An electronic device comprising:
   a substrate having a dented portion and a non-dented portion;
   a gate electrode having side surfaces, a bottom surface, and a top surface, wherein the side surfaces are in direct physical contact with the dented portion of the substrate;
   a source electrode and a drain electrode located at the non-dented portion of the substrate; and
   a semiconductor layer located on the gate electrode and in contact with the source electrode and the drain electrode,
   wherein the gate electrode, the source electrode, and the drain electrode are formed of at least one of molybdenum, tungsten, copper, aluminum, titanium, an alloy thereof, nanowire, graphene, carbon nanotube, indium tin oxide, indium zinc oxide and combinations thereof.

2. The electronic device of claim 1, further comprising an insulating layer between the gate electrode and the semiconductor layer.

3. The electronic device of claim 1, wherein the semiconductor layer is formed of a material selected from the group consisting of amorphous silicon, organic semiconductor, and oxide semiconductor.

4. The electronic device of claim 1, wherein the gate electrode is connected to a conductive layer pattern located at the non-dented portion of the substrate.

5. The electronic device of claim 1, wherein the semiconductor layer is formed of a material different from the source electrode and the drain electrode.

* * * * *